United States Patent
Shiota et al.

(10) Patent No.: US 6,410,945 B1
(45) Date of Patent: Jun. 25, 2002

(54) HETEROJUNCTION BIPOLAR TRANSISTOR AND ITS MANUFACTURING PROCESS

(75) Inventors: Masahiro Shiota, Soraku-gun; Toshiyuki Shinozaki, Tenri; Hideyuki Tsuji, Nara; Toshiaki Kinosada, Osaka-fu, all of (JP)

(73) Assignee: Sharp Kabushiki Kaisha, Osaka (JP)

(*) Notice: Subject to any disclaimer, the term of this patent is extended or adjusted under 35 U.S.C. 154(b) by 0 days.

(21) Appl. No.: 09/603,433

(22) Filed: Jun. 23, 2000

(30) Foreign Application Priority Data

Jun. 25, 1999  (JP) .......................... 11-180138

(51) Int. Cl.[7] .......................... H01L 31/0328
(52) U.S. Cl. .................. 257/191; 255/186; 255/187; 255/183; 255/197
(58) Field of Search .................. 257/183, 186–187, 257/191, 197–198, 26, 29, 580–582

(56) References Cited

U.S. PATENT DOCUMENTS 5,719,415 A * 2/1998 Yagura et al. .............. 257/191
6,057,567 A * 5/2000 Bayraktaroglu ............. 257/197

FOREIGN PATENT DOCUMENTS

| JP | 04286126 A | * 10/1992 | ............. 257/197 |
|---|---|---|---|
| JP | 6-349847 | 12/1994 | |
| JP | 7-7013 | 1/1995 | |
| JP | 10-335345 | 12/1998 | |

OTHER PUBLICATIONS

Hongo et al.; Solid State Devices and Materials, "Highly Reproducible Fabrication Process for Passivated AlGaAs/GaAs HBT's with Pt/Ti/Pt/Au Base Electrodes" Toshiba Research and Development Center, Kawasaki, Japan; pp. 613–615 (1994).

* cited by examiner

Primary Examiner—Minh Loan Tran
Assistant Examiner—T. Dickey
(74) Attorney, Agent, or Firm—Nixon & Vanderhye P.C.

(57) ABSTRACT

A heterojunction bipolar transistor having a ballast resistance layer between an AlGaAs emitter layer and an emitter electrode, wherein the ballast resistance layer comprises $n\text{-}Al_xGa_{1-x}As$, wherein $0<X<1$, and a GaAs selective etching layer is provided between the emitter layer and the ballast resistance layer.

8 Claims, 10 Drawing Sheets

HETEROJUNCTION BIPOLAR TRANSISTOR AND ITS MANUFACTURING PROCESS

CROSS-REFERENCE TO RELATED APPLICATION

This application is related to Japanese Patent Application No. HEI11(1999)-180138 filed on Jun. 25, 1999, whose priority is claimed under 35 USC § 119, the disclosure of which is incorporated by reference in its entirety.

BACKGROUND OF THE INVENTION

1. Field of the Invention

The present invention relates to a heterojunction bipolar transistor usable in a MMIC (monolithic microwave integrated circuit) for a portable telephone and its manufacturing process.

2. Description of Related Art

One problem of heterojunction bipolar transistors for power supply has been a thermal runaway. The thermal runaway means a phenomenon of breakdown of a heterojunction bipolar transistor by positive feed-back of heat. During operation of the heterojunction bipolar transistor, heat is generated by a collector current. This heat increases the collector current, which further generates heat, and so on. This is the positive feed-back of heat.

For preventing the thermal runaway, it is known to change the composition ratio of aluminum in an AlGaAs emitter layer and to provide a ballast resistor.

A conventional AlGaAs/GaAs heterojunction bipolar transistor is now explained.

Japanese Unexamined Patent Publication No. HEI 7(1995)-7013 proposes a heterojunction bipolar transistor having an emitter layer of n-$Al_xGa_{1-x}As$ wherein an Al composition ratio X is larger than 0.4. According to this transistor, the emitter layer acts as an emitter and also acts as a ballast resistor, and thereby, electrons in an X-valley which have a great effective mass can be used. Consequently, electron mobility can be decreased and an emitter resistance (Re) can be effectively raised while keeping the $Al_xGa_{1-x}As$ emitter layer in a practical thickness.

However, in this transistor, since the emitter resistance (Re) is raised by adjusting the Al composition ratio X in the n-$Al_xGa_{1-x}As$ emitter layer, the emitter resistance (Re) is already high before the collector current increases and the characteristics of the transistor may be degraded.

Japanese Examined Patent Publication No. 2662039 discloses the formation of an n-GaAs resistor layer on an n-AlGaAs emitter layer, which resistor is of the same electroconductivity type as the emitter layer, has a lower impurity concentration than the emitter layer, is different from the emitter in composition, and has the action of a ballast resistance. In an example of the publication, described is a transistor provided with an AlGaAs emitter layer (of 0.25 $\mu$m thickness) having an Al composition ratio of 0.3 and an n-type impurity concentration of $5 \times 10^{17}/cm^3$ and an n-GaAs resistor layer (of 0.4 $\mu$m thickness) having an n-type impurity concentration of $1 \times 10^{16}/cm^3$.

Japanese Unexamined Patent Publication No. HEI 10(1998)-335345 proposes a transistor provided with a ballast resistance layer of a GaAs layer formed on an AlGaAs emitter layer and a GaAs carrier supply layer formed between the emitter layer and the ballast resistance layer, the carrier supply layer having such a carrier concentration that depletion does not occur at junction. According to this transistor, the ballast resistance layer prevents the thermal runaway of the transistor and the carrier supply layer prevents diffusion of electrons from the emitter layer having a high impurity concentration to the ballast resistance layer having a low impurity concentration. Consequently, the current-amplification factor β can be kept from dropping.

However, since these n-GaAs resistor layer and ballast resistance layer act as parasitic resistance, there is a problem that they deteriorate the characteristics of the heterojunction bipolar transistors.

Accordingly, the ballast resistance layer is desired to be such that the emitter resistance is low in a normal operation state, i.e., in a state where the temperature of the transistor is low, and the emitter resistance is high in a thermal runaway state, i.e., in a state where the temperature of the transistor is high.

In other words, the ballast resistance layer is desired to provide a high temperature coefficient of the emitter resistance (simply referred to as temperature coefficient hereinafter).

However, the conventional GaAs ballast resistance layers have a relatively low temperature coefficient, which is only about 0.001° C.$^{-1}$.

Temperature characteristics of the emitter resistance (Re) were evaluated, for example, with a heterojunction bipolar transistor as shown in an example of Japanese Examined Patent Publication No. 2662039 which has a GaAs ballast resistance layer and an emitter area of 100 $\mu m^2$ and a transistor as proposed by Japanese Unexamined Patent Publication No. HEI10(1998)-335345 which has an emitter area of 100 $\mu m^2$, a ballast resistance layer of GaAs on an AlGaAs emitter layer and a GaAs carrier supply layer between the emitter layer and the ballast resistance layer, the carrier supply layer having such a carrier concentration that depletion does not take place at junction. FIG. 11 shows the temperature characteristics of the emitter resistance (Re) in these transistors. It was found that the emitter resistance (Re) changes little with temperature change and consequently acts little as negative feed-back of heat against the thermal runaway.

Japanese Unexamined Patent Publication No. HEI 6(1994)-349847 proposes a transistor which, as shown in FIG. 16, has a ballast resistance layer of an n-$Al_xGa_{1-x}AS$ layer 9 instead of a GaAs layer formed on an AlGaAs emitter layer 6. This publication describes that the Al composition ratio X in the ballast resistance layer is preferably 0<X≦0.45. If the Al composition ratio X is within this range, an energy gap between conduction band valleys in the n-$Al_xGa_{1-x}As$ layer can be adjusted, so that the temperature rises in a predetermined conduction band structure, also an increased number of electrons can be thermally excited from a conduction band (Γ valley) where electrons have a small effective mass to higher-level conduction bands (X valley, L valley) where electrons have a large effective mass and the electron mobility decreases. Consequently, the emitter resistance of the ballast resistance layer is low before the thermal runaway occurs and is high after the thermal runaway is induced by an increased collector current. Thus the thermal runaway of the transistor can be effectively prevented. That is, the formation of such a ballast resistance layer can suppress an increase in parasitic resistance components in the transistor and prevent the thermal runaway of the transistor.

However, in these transistors, since a base electrode is formed on the p-GaAs base layer, an insulating layer of SiN, SiO or the like is typically formed on the surface of the p-GaAs base layer. There has been a problem that the characteristics of the heterojunction bipolar transistors change because of unstableness of this insulating layer.

To cope with this problem, in Extended Abstracts of the 1994 International Conference on Solid State Devices and Materials, Yokohama, 1994, pp. 613–615 (referred to Extended Abstracts hereinafter), proposed is a transistor in which a base electrode is formed not on a p-GaAs base layer but on an n-AlGaAs emitter layer on the p-GaAs base layer.

If such a construction of the base electrode formed on the n-AlGaAs emitter layer is incorporated into the construction of Japanese Unexamined Patent Publication No. HEI 6(1994)-349847 (FIG. 15), an n-$Al_{0.3}Ga_{0.7}As$ emitter layer and an n-$Al_{0.35}Ga_{0.65}As$ ballast resistance layer are sequentially formed on a p+GaAs base layer. Accordingly, it is necessary to expose the n-$Al_{0.3}Ga_{0.7}As$ emitter layer by sequentially etching an n+-GaAs contact layer, a graded n-$Al_YGa_{1-Y}As$ layer and an n-$Al_{0.35}Ga_{0.65}As$ ballast resistance layer from a substrate surface side.

In this case, it is impossible to conduct a so-called selective etching so as to stop etching when the n-$Al_{0.3}Ga_{0.7}As$ emitter layer is exposed. Accordingly adjustment needs to be made by controlling the etching time. For this reason, there has been a problem in that the thickness of the emitter layer varies greatly. Since the thickness of the emitter layer (typically about 50 nm) much affects base leakage current, the base resistance, current-amplification factor and stability of characteristics of the heterojunction bipolar transistor, there is a problem that it is difficult to obtain transistor having stable characteristics if the thickness of the emitter layer is not uniform. Furthermore, in the case where the emitter layer, after exposed, is partially removed by continued etching under further control of the etching time, the thickness of the emitter layer varies more greatly.

In the aforesaid Extended Abstracts, it is described that a contact layer of InGaAs is formed on the top surface of a wafer for reducing or stabilizing a contact resistance in an emitter electrode.

However, in the case where the InGaAs contact layer is formed on a GaAs layer, these layers have greatly different crystal lattice constants and consequently it is difficult to form the layers without misfit dislocation. In the case where the InGaAs contact layer is about 100 nm thick, projections and depressions of about 10 to 20 nm are generated on the surface of the InGaAs contact layer by the misfit dislocation.

In Japanese Unexamined Patent Publication No. HEI 6(1994)-349847, if the InGaAs contact layer is formed on the top surface of the wafer, the projections and depressions on the surface of the InGaAs layer remain as they are on the n-AlGaAs emitter layer through etching under the control of the etching time before the formation of the base electrode. The characteristics of the transistor become much more unstable.

Thus, according to the transistor of Japanese Unexamined Patent Publication No. HEI 6(1994)-349847, the transistor of the Extended Abstracts and a combination of these transistors, the thermal runaway can be effectively prevented. However, since the thickness of the emitter layers is not uniform, it has been difficult to manufacture transistors having stable characteristics.

As mentioned above, it has been difficult to simultaneously realize the suppression of the emitter resistance (Re) within such a range as does not cause any problem in practical use, the prevention of the thermal runaway of the transistor and the manufacture of transistors having stable characteristics.

SUMMARY OF THE INVENTION

In view of the above mentioned problems, the inventors of the present invention have found that a heterojunction bipolar transistor whose ballast resistance layer is formed of n-$Al_XGa_{1-X}As$ (Al composition ratio X:$0.15 \leq X \leq 0.35$) uses, for conduction of electrons, the "Γ valley electrons" in the AlGaAs ballast resistance layer which exhibit high mobility before the thermal runaway takes place, and after the thermal runaway takes place, uses the "X valley electrons, L valley electrons" exhibiting low mobility due to generated heat; consequently that it is possible to decrease the temperature characteristics of the emitter resistance (Re) of the transistor within such a range as does not cause practical problems while keeping the temperature characteristics in a state of negative feed-back of heat for preventing the thermal runaway caused by an increased collector current; also that a GaAs selective etching layer between the ballast resistance layer and the emitter layer allows uniform thickness for the AlGaAs emitter layer, so that controllability and reproducibility can be improved while the emitter resistance (Re) is kept small. Thus the present invention has been achieved.

Accordingly, the present invention provides a heterojunction bipolar transistor having a ballast resistance layer between an AlGaAs emitter layer and an emitter electrode, wherein the ballast resistance layer comprises n-$Al_XGa_{1-X}As$, wherein 0<X<1, and a GaAs selective etching layer is provided between the emitter layer and the ballast resistance layer.

The present invention also provides a process for manufacturing a heterojunction bipolar transistor having a laminated structure of a GaAs collector layer, a GaAs base layer, an AlGaAs emitter layer, a GaAs selective etching layer and an n-$Al_XGa_{1-X}As$ ballast resistance layer, wherein 0<X<1, and having a collector electrode, a base electrode and an emitter electrode. The process includes the steps of:

a) forming the GaAs selective etching layer and the n-$Al_XGa_{1-X}As$ ballast resistance layer sequentially on the AlGaAs emitter layer;

b) etching the n-$Al_XGa_{1-X}As$ ballast resistance layer or the n-$Al_XGa_{1-X}As$ ballast resistance layer and the GaAs selective etching layer in a desired pattern in such a manner that etching stops in the GaAs selective etching layer; and c) selectively etching the remaining GaAs selective etching layer in a desired pattern.

These and other objects of the present application will become more readily apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
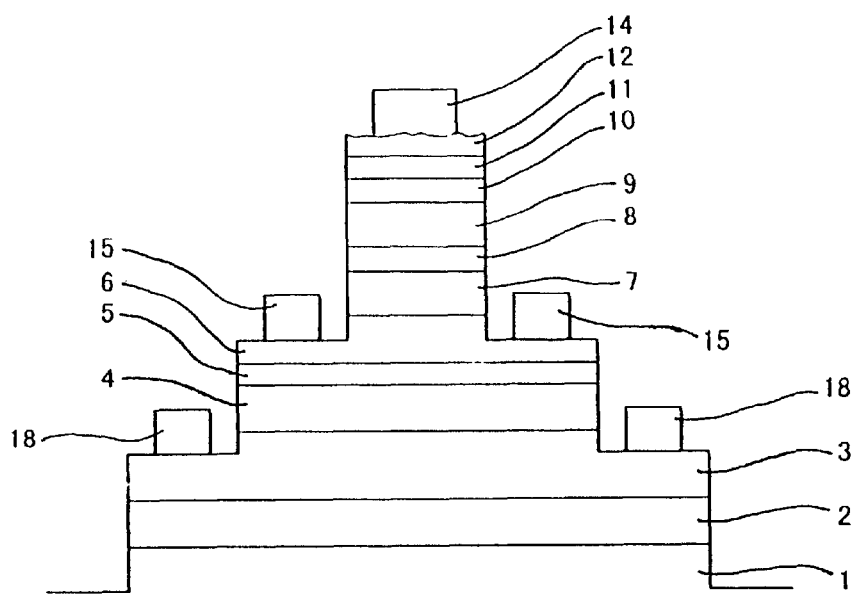
FIG. 1 is a schematic sectional view illustrating the construction of a heterojunction bipolar transistor in accordance with the present invention.

The heterojunction bipolar transistor of the present invention has an n-$Al_xGa_{1-x}As$ (0<X<1) ballast resistance layer between an AlGaAs emitter layer and an emitter electrode and a GaAs selective etching layer between the emitter layer and the ballast resistance layer.

The thickness of the AlGaAs emitter layer may be 30 to 200 nm, preferably 50 to 150 nm. Impurities which may be added into the AlGaAs emitter layer are, for example, Si, Se and the like, among which Si is preferred. The concentration of an impurity added varies depending upon the kind of the impurity, but may be about $1\times10^{17}$ to $8\times10^{17}/cm^3$, for example.

The Al composition ratio X in the n-$Al_xGa_{1-x}As$ ballast resistance layer may be 0<X≦0.4, preferably 0.15≦X≦0.35. The thickness of this ballast resistance layer may be 100 to 500 nm, preferably 100 to 300 nm. Impurities which may be added into the ballast resistance layer are, for example, Si Se and the like, among which Si is preferred. The concentration of an impurity added varies depending upon the kind of the impurity, but may be about $1\times10^{16}$ to $2\times10^{17}/cm^3$, for example.

Preferably, the GaAs selective etching layer has a lower electric resistance than the ballast resistance layer and has as large a thickness as possible so that when non-selective etching is carries out until the GaAs selective etching layer is exposed as described later, the etching can be easily stopped in the GaAs selective etching layer even if the etching amount varies. The thickness of the GaAs selective etching layer may be 100 to 300 nm, for example. Preferably, the GaAs selective etching layer has a selective etching ratio of 50 or more with respect to the AlGaAs emitter layer formed under the GaAs selective etching layer in order that selective etching described later will be done perfectly. Impurities which may be added into the GaAs selective etching layer are, for example, Si, Se and the like, among which Si is preferred. The concentration of an impurity added varies depending upon the kind of the impurity, but may be about $1\times10^{17}$ to $2\times10^{18}/cm^3$, for example.

The heterojunction bipolar transistor of the present invention is preferably provided with an InGaAs contact layer formed under the emitter electrode for preventing diffusion between the emitter electrode and the ballast resistance layer. The thickness of the InGaAs contact layer is not particularly limited, but may be, for example, 50 to 200 nm, preferably 100 to 150 nm. Impurities which may be added into the InGaAs contact layer are, for example, Si, Se and the like, among which Si is preferred. The concentration of an impurity added varies depending upon the kind of the impurity, but may be about $2\times10^{18}$ to $2\times10^{19}/cm^3$, for example.

Also, in the heterojunction bipolar transistor of the present invention, a GaAs contact layer may further be formed under the above-described InGaAs contact layer.

Also, in the heterojunction bipolar transistor of the present invention, AlGaAs graded layers may be formed on and under the n-$Al_xGa_{1-x}As$ ballast resistance layer.

The process for manufacturing a heterojunction bipolar transistor according to the present invention includes the following steps:

a) forming a GaAs selective etching layer and an AlGaAs ballast resistance layer sequentially on an AlGaAs emitter layer;

b) etching the AlGaAs ballast resistance layer or the AlGaAs ballast resistance layer and the GaAs selective etching layer in a desired pattern in such a manner that etching stops in the GaAs selective etching layer; and c) selectively etching the remaining GaAs selective etching layer in a desired pattern.

The AlGaAs emitter layer is formed on a semiconductor substrate having a GaAs collector layer and a GaAs base layer formed thereon in this order. Subsequently, the GaAs selective etching layer and the AlGaAs ballast resistance layer are formed on the AlGaAs emitter layer in this order. The GaAs collector layer, GaAs base layer, AlGaAs emitter layer, GaAs selective etching layer and AlGaAs ballast resistance layer may be formed by a known method, for example, a molecular beam epitaxy method, an organometallic vapor phase epitaxy method or the like.

An undoped GaAs layer and/or a GaAs collector contact layer may be optionally formed on the semiconductor substrate.

In order that etching is stopped in the GaAs selective etching layer, the etching may be conducted by a method such as wet etching, dry etching or the like, but wet etching is preferred. An etching solution used for this wet etching may be an acid-containing etchant, for example. Particularly, a mixed solution of phosphoric acid, aqueous hydrogen peroxide and water is preferred.

Here, to conduct etching so that it is stopped in the GaAs selective etching layer means that the ballast resistance layer is completely removed and the etching is stopped on the surface of the selective etching layer or that the ballast resistance layer is completely removed, the selective etching layer is partially removed and the etching is stopped within the selective etching layer.

In order to stop the etching in the GaAs selective etching layer, the etching is carried out with controlling the etching time in the process of the present invention. According to this process, the total etching amount is liable to vary. However, the beforehand formation of the thick GaAs selective etching layer facilitates the stopping of the etching in the GaAs selective etching layer.

Selective etching of the GaAs selective etching layer may be conducted by wet etching, dry etching or the like, but wet etching is preferred.

An etching solution used for this wet etching is not particularly limited so long as it allows selective etching of the GaAs selective etching layer with the AlGaAs emitter layer as an underlying layer, but may be an organic acid-containing etchant, for example. Particularly, a mixed solution of aqueous citric acid and aqueous hydrogen oxide is preferred.

In the process of the present invention, the AlGaAs emitter layer exposed by the selective etching of the GaAs selective etching layer may further be etched to have a desired thickness.

Thereafter, by a known method, for example, photoetching method or the like, an emitter electrode, a base electrode and a collector electrode are formed on the ballast resistance layer, the AlGaAs emitter layer and the collector layer, respectively. Thus the heterojunction bipolar transistor is formed.

EXAMPLE

An example of the present invention is now described in detail with reference to the attached drawings.

Figure 2:
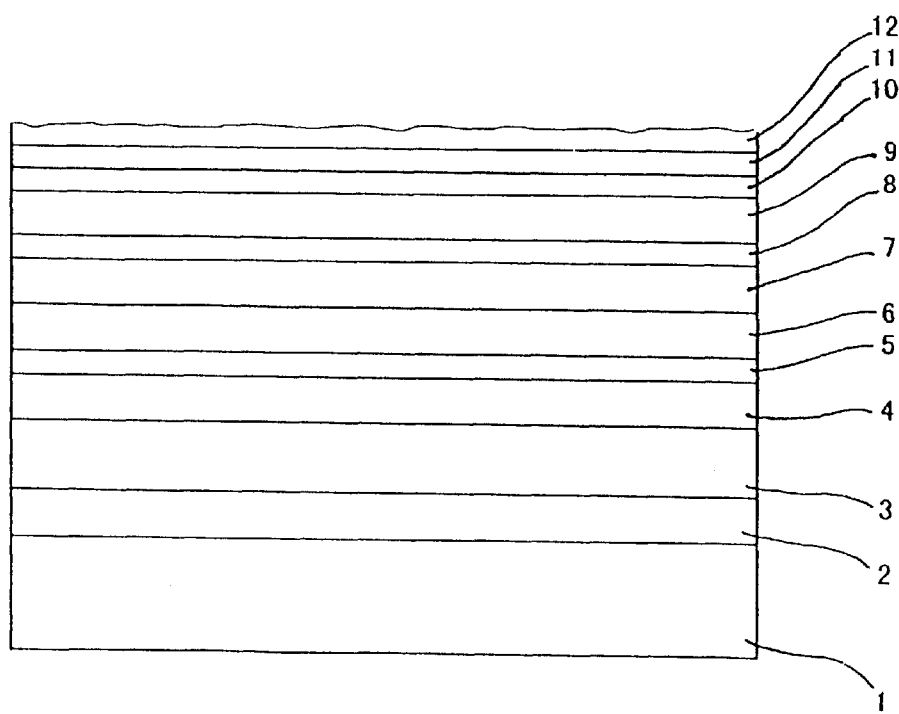
FIG. 2 is a schematic sectional view illustrating a process for manufacture of a heterojunction bipolar transistor in accordance with the present invention.

First, as shown in FIG. 2, on a GaAs substrate 1, formed are an undoped GaAs layer 2 of 300 nm thickness, a GaAs collector contact layer 3 of 500 nm thickness with an impurity Si concentration of $5\times10^{18}/cm^3$, a GaAs collector layer 4 of 500 nm thickness with an impurity Si concentration of $2\times10^{16}/cm^3$, a GaAs base layer 5 of 90 nm thickness with an impurity C concentration of $2\times10^{19}/cm^3$, an $Al_XGa_{1-X}As$ (X=0.3) emitter layer 6 of 120 nm thickness with an impurity Si concentration of $5\times10^{17}/cm^3$, a GaAs selective etching layer 7 of 150 nm thickness with an impurity Si concentration of $5\times10^{17}/cm^3$, a graded AlGaAs (Al composition ratio: 0 to 0.35) layer 8 of 30 nm thickness with an impurity Si concentration of $2\times10^{18}/cm^3$, an $Al_YGa_{1-Y}As$ (Y=0.35) ballast layer 9 of 200 nm thickness with an impurity Si concentration of $5\times10^{16}/cm^3$, a graded AlGaAs (Al composition ratio: 0 to 0.35) layer 10 of 30 nm thickness with an impurity Si concentration of $2\times10^{18}/cm^3$, a GaAs contact layer 11 of 100 nm thickness with an impurity Si concentration of $5\times10^{18}/cm^3$ and an $In_ZGa_{1-Z}As$ (Z=0.6) contact layer 12 of 120 nm thickness with an impurity Si concentration of $2\times10^{19}/cm^3$ in this order using a method of organometallic vapor phase epitaxy or the like.

Figure 3:
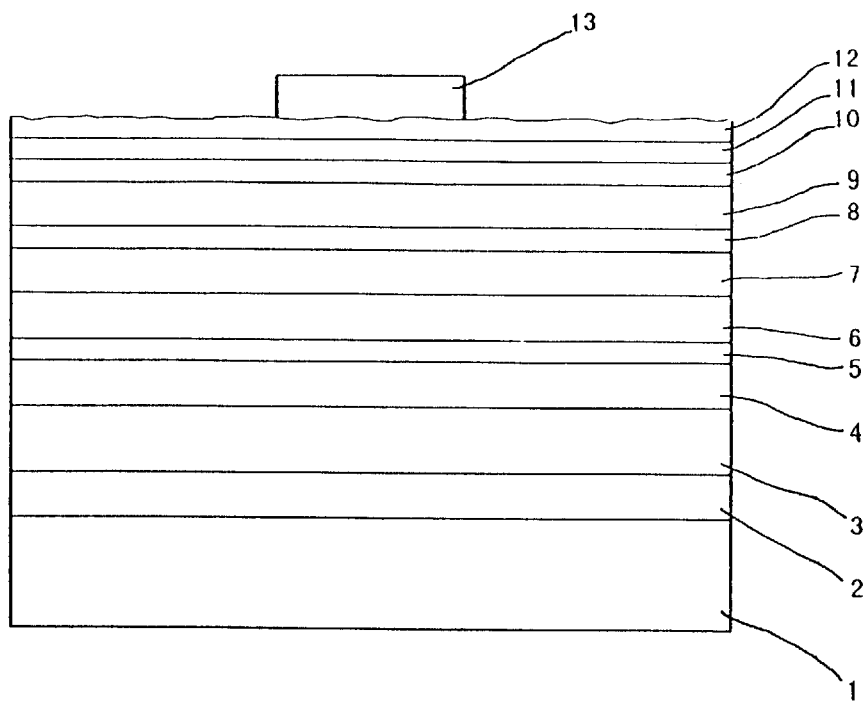
FIG. 3 is a schematic sectional view illustrating the process for manufacture of the heterojunction bipolar transistor in accordance with the present invention.
Figure 4:
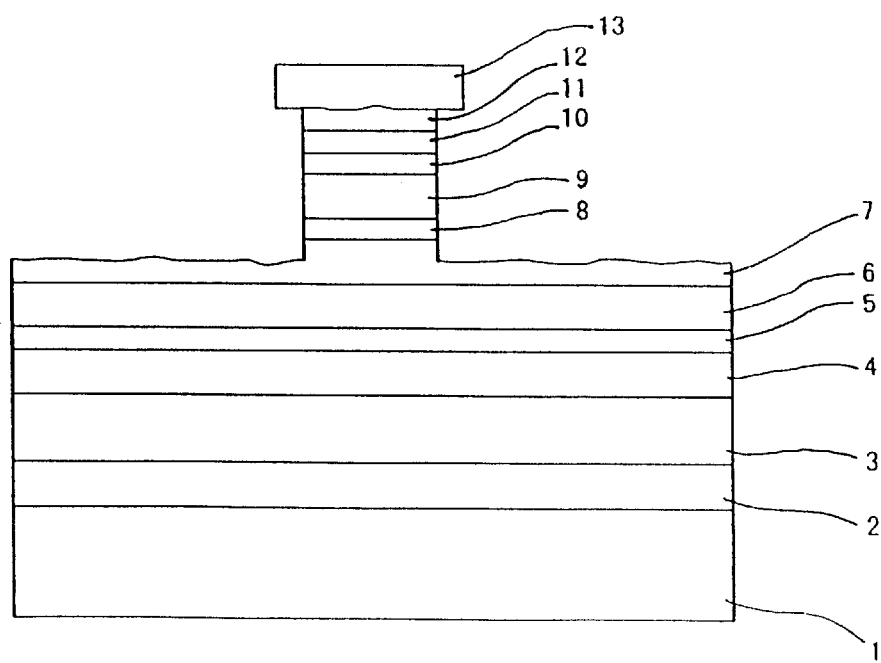
FIG. 4 is a schematic sectional view illustrating the process for manufacture of the heterojunction bipolar transistor in accordance with the present invention.

Subsequently, as shown in FIG. 3, a resist pattern 13 is formed on the InGaAs contact layer 12 by a usual photoetching process. Thereafter, etching is carried out on the InGaAs contact layer 12 down to the GaAs selective etching layer 7 using a mixed solution of phosphoric acid, aqueous hydrogen peroxide and water (mixture ratio: 5:1:50) as shown in FIG. 4. Since the mixed solution of phosphoric acid, aqueous hydrogen peroxide and water used here is not selective to InGaAs, GaAs and AlGaAs, the etching is conducted with controlling the etching time until a desired layer (the GaAs selective etching layer 7) is exposed. Such etching with controlling the etching time may lead to variations in the total etching amount. However, since the exposed GaAs selective etching layer 7 has been formed thick (150 nm) beforehand, it is not difficult to stop the etching in the GaAs selective etching layer 7.

As shown in FIG. 4, the surface of the GaAs selective etching layer 7, after etched, has projections and depression transferred from the surface of the InGaAs contact layer 12 as they are.

Figure 5:
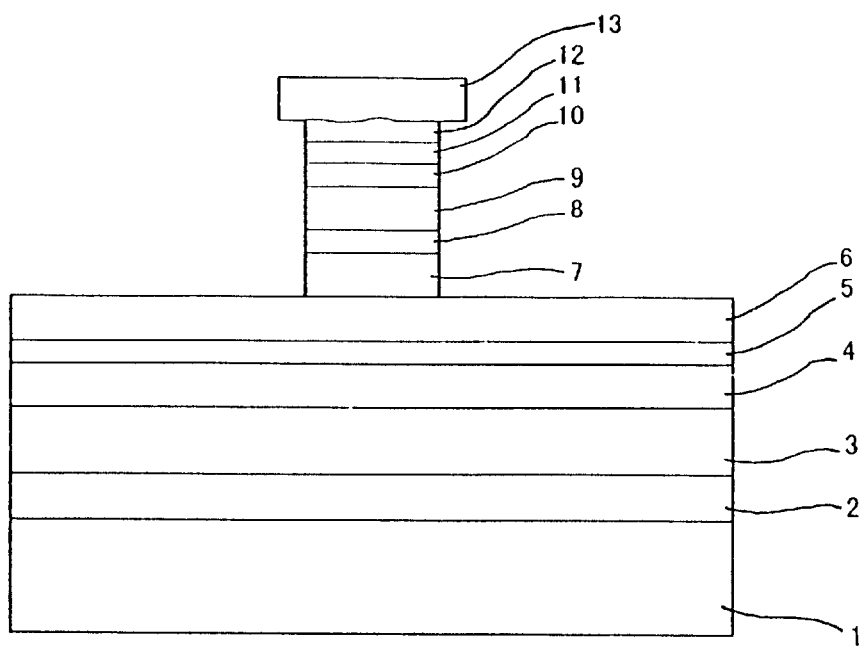
FIG. 5 is a schematic sectional view illustrating the process for manufacture of the heterojunction bipolar transistor in accordance with the present invention.

Thereafter, the GaAs selective etching layer 7 is selectively etched using a mixed solution of aqueous citric acid (3 wt %) and aqueous hydrogen peroxide (30 wt %) (mixture ratio: 80:1) to expose the AlGaAs emitter layer 6 (see FIG. 5).

Figure 6:
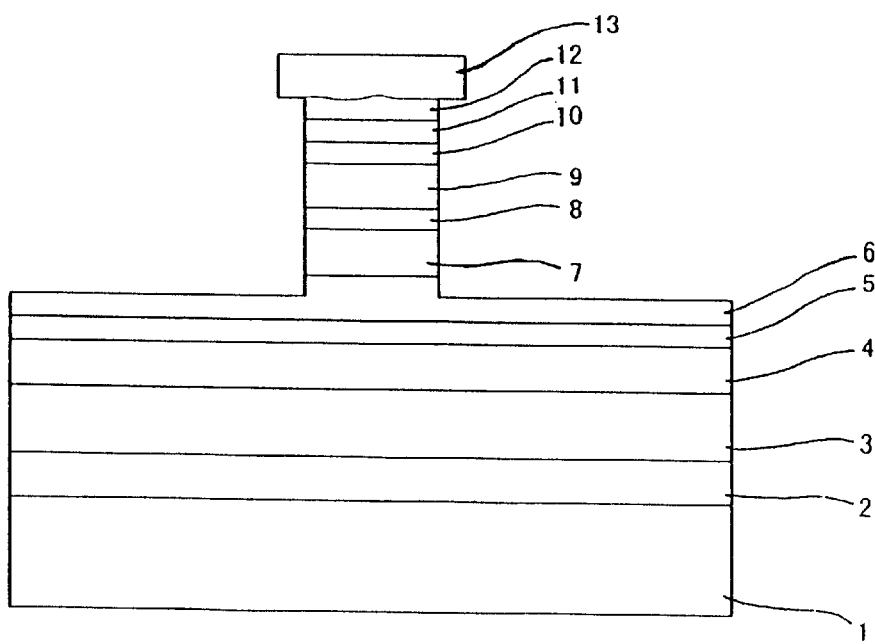
FIG. 6 is a schematic sectional view illustrating the process for manufacture of the heterojunction bipolar transistor in accordance with the present invention.

This selective etching removes the projections and depressions on the surface of the GaAs selective etching layer 7 completely (see FIG. 5). Thereafter, the AlGaAs emitter layer 6 is etched to have a thickness of about 50 nm using a mixed solution of phosphoric acid, aqueous hydrogen peroxide and water (mixture ratio: 5:1:50) (see FIG. 6). Here, the etching is conducted with controlling the etching time. However, since the total etching amount at this time is as small as 50 nm, the thickness of the AlGaAs emitter layer 6 does not vary to such an extent as may cause inconveniences in practical use.

Through the above-described steps, the AlGaAs emitter layer 6 can be formed uniformly to a desired thickness without projections and depressions.

Figure 7:
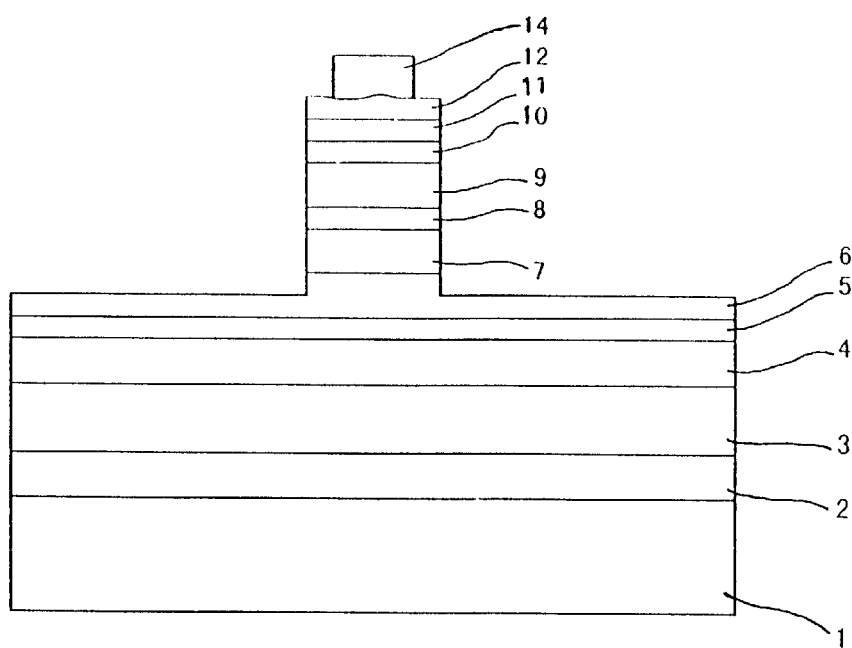
FIG. 7 is a schematic sectional view illustrating the process for manufacture of the heterojunction bipolar transistor in accordance with the present invention.

Next, the resist pattern 13 having been used as an etching mask is removed using an organic solvent. Thereafter, as shown in FIG. 7, an emitter electrode 14 of W/Ti/Au is formed on the InGaAs contact layer 12 by a usual photoetching process.

Figure 8:
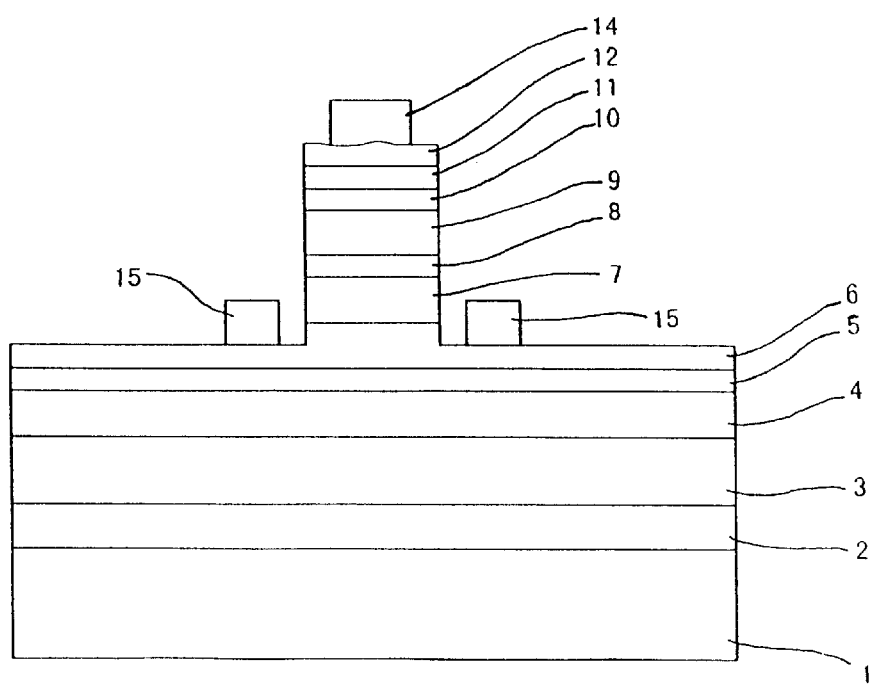
FIG. 8 is a schematic sectional view illustrating the process for manufacture of the heterojunction bipolar transistor in accordance with the present invention.

Subsequently, a base electrode 15 of Pt/Ti/Au is formed on the AlGaAs emitter layer 6 by a usual photoetching process (see FIG. 8)

Figure 9:
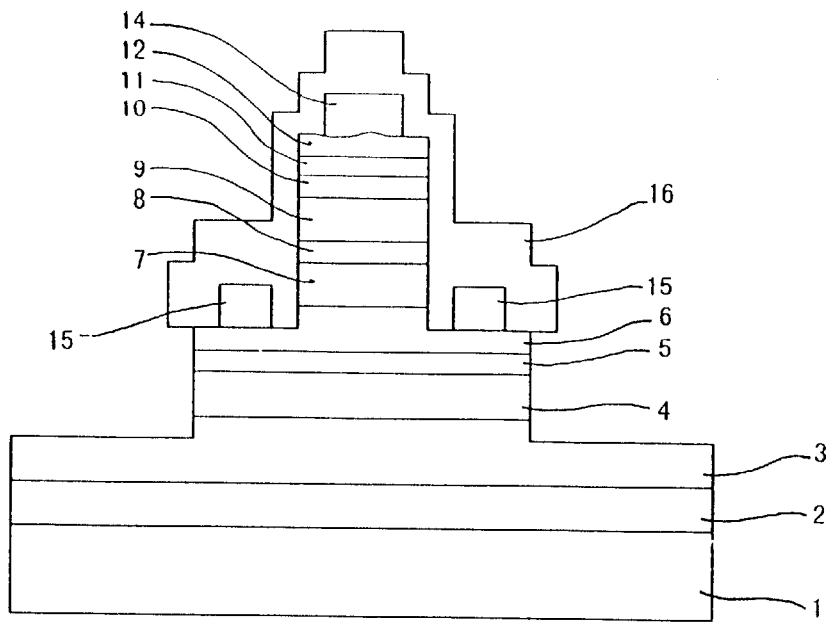
FIG. 9 is a schematic sectional view illustrating the process for manufacture of the heterojunction bipolar transistor in accordance with the present invention.

Thereafter, a resist pattern 16 as shown in FIG. 9 is formed on the AlGaAs emitter layer 6, the base electrode 15, the InGaAs contact layer 12 and the emitter electrode 14, and the $Al_XGa_{1-X}As$ (X=0.3) emitter layer 6, the GaAs base layer 5, the GaAs collector layer 4 and the GaAs collector contact layer 3 are etched using a mixed solution of phosphoric acid, aqueous hydrogen peroxide and water (mixture ratio: 5:1:50).

Figure 10:
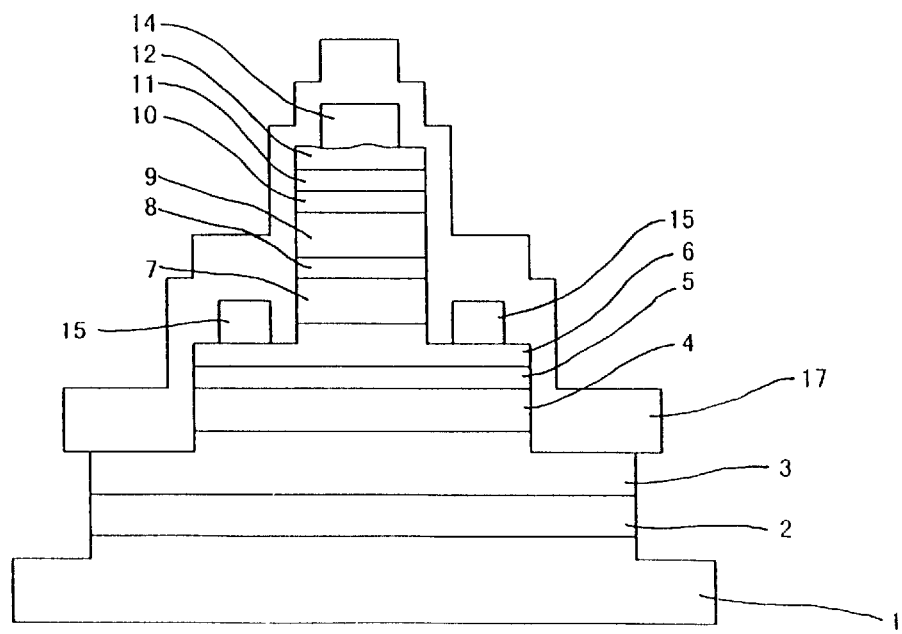
FIG. 10 is a schematic sectional view illustrating the process for manufacture of the heterojunction bipolar transistor in accordance with the present invention.

Thereafter, the resist pattern 16 is removed using an organic solvent. Subsequently, a resist pattern 17 as shown in FIG. 10 is formed on the GaAs collector contact layer 3, the AlGaAs emitter layer 6, the base electrode 15, the InGaAs contact layer 12 and the emitter electrode 14.

Thereafter, the GaAs collector contact layer 3 with the impurity Si concentration of $5\times10^{18}/cm^3$ is completely removed to form device isolation.

Then, the resist pattern 17 is removed using an organic solvent.

Thereafter, a collector electrode 18 of AuGe/Ni/Au is formed on the GaAs collector contact layer 3 by a photo-etching process to produce a heterojunction bipolar transistor as shown in FIG. 1.

Figure 11:
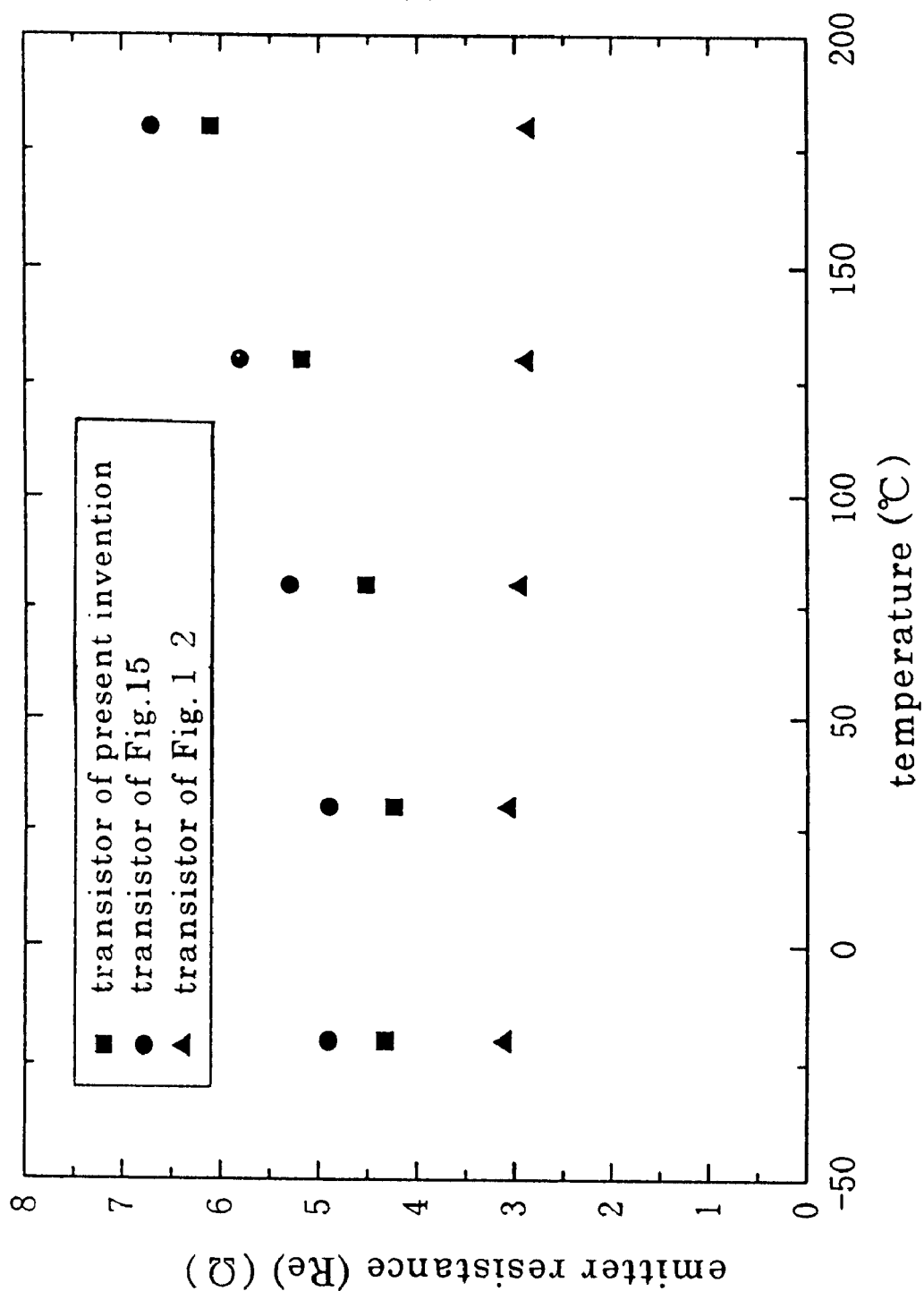
FIG. 11 is a chart showing the dependence of the emitter resistance (Re) of a heterojunction bipolar transistor in accordance with the present invention and a conventional heterojunction bipolar transistor upon temperature.
Figure 12:
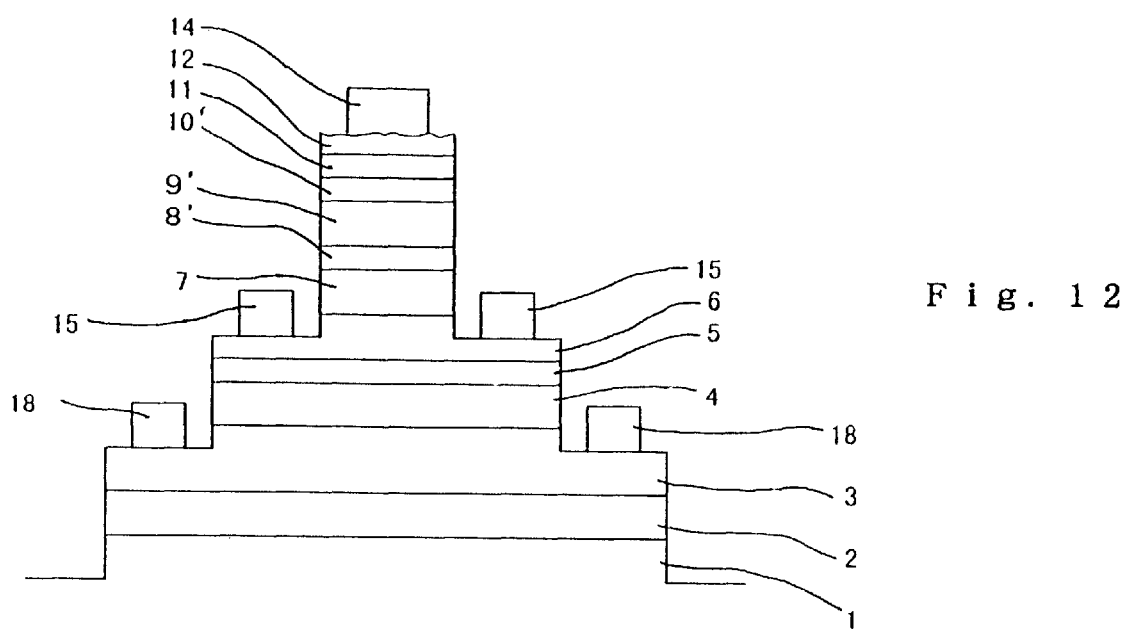
FIG. 12 is a schematic sectional view illustrating the construction of a heterojunction bipolar transistor produced as a control to a heterojunction bipolar transistor in accordance with the present invention.
Figure 15:
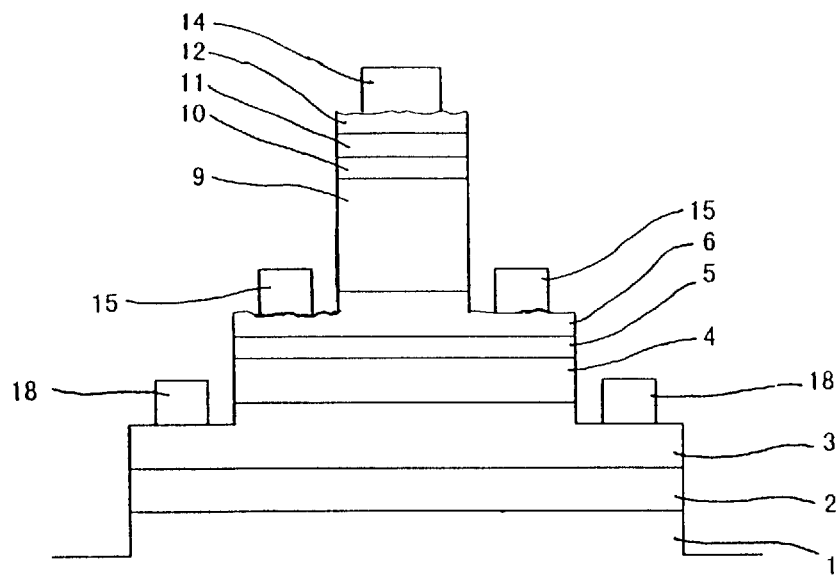
FIG. 15 is a schematic sectional view illustrating the construction of a heterojunction bipolar transistor which has a ballast resistance layer, an AlGaAs emitter layer under a base electrode and an InGaAs contact layer on the top surface as disclosed by Japanese Unexamined Patent Publication No. HEI 6(1994)-349847.
Figure 16:
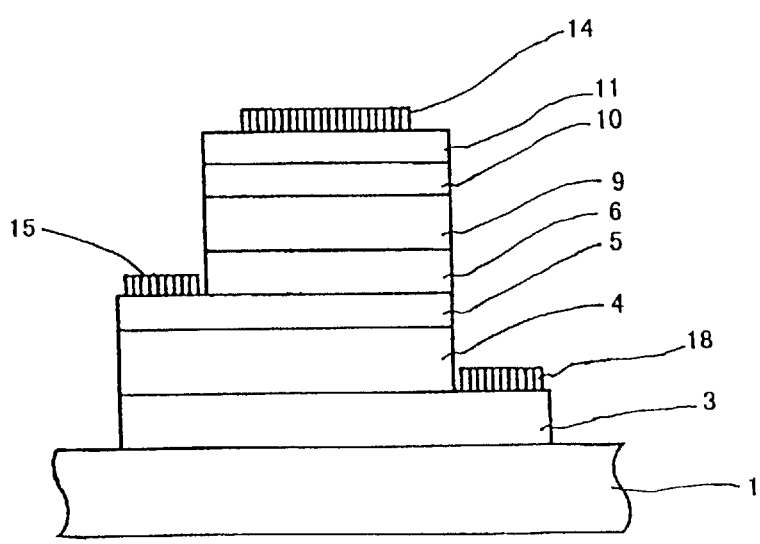
FIG. 16 is a schematic sectional view illustrating the construction of a conventional heterojunction bipolar transistor.

FIG. 11 shows the temperature characteristics of the emitter resistance (Re) in the heterojunction bipolar transistor produced in the above example (indicated by mark ■ in FIG. 11). FIG. 15 shows a heterojunction bipolar transistor (Japanese Unexamined Patent Publication HEI 6(1994)-349847) having an AlGaAs ballast resistance layer 9, an AlGaAs emitter layer 6 under a base electrode 15 and an InGaAs contact layer 12 on the top surface. FIG. 11 also shows the temperature characteristics of the emitter resistance (Re) in the transistor of FIG. 15 (indicated by a mark ● in FIG. 11). FIG. 12 shows a heterojunction bipolar transistor having a ballast resistance layer of GaAs (AlGaAs 9 of FIG. 1 in the case where the Al composition ratio is 0). FIG. 11 further shows the temperature characteristics of the emitter resistance (Re) in this transistor (indicated by a mark ▲ in FIG. 11).

As clearly understood from FIG. 11, the emitter resistance increases as temperature rises in the heterojunction bipolar transistor of the present invention as in the transistor of Japanese Unexamined Patent Publication HEI 6(1994)-349847. This shows that the transistor of the present invention has the function of suppressing the thermal runaway as the transistor of Japanese Unexamined Patent Publication HEI 6(1994)-349847.

FIG. 11 also shows that the emitter resistance (Re) does not exhibit so great an increase in the transistor of the present invention. This is because the transistor has the GaAs selective etching layer, which has a lower electric resistance than the AlGaAs ballast layer, between the AlGaAs emitter layer and the AlGaAs ballast layer.

FIG. 11 also shows that the emitter resistance (Re) does not increase with temperature rise in the transistor having the GaAs ballast resistance layer. This shows the transistor does not have the function of suppressing the thermal runaway.

Comparative Example heterojunction bipolar transistors were produced in the same manner as in the above example except that the layers 8, 9 and 10 in the example are changed to a graded AlGaAs (Al composition ratio: 0 to Z) layer 8' of 30 nm thickness with an impurity Si concentration of $2 \times 10^{18}/cm^3$, an $Al_zGa_{1-z}As$ ballast layer 9' of 200 nm thickness with an impurity Si concentration of $5 \times 10^{16}/cm^3$ and a graded AlGaAs (Al composition ratio: Z to 0) layer 10' of 30 nm thickness with an impurity Si concentration of $2 \times 10^{18}/cm^3$, respectively, and the Al composition ratio Z in the $Al_zGa_{1-z}As$ ballast layer 9' is changed to 0, 0.15, 0.25, 0.35 and 0.4 (where Z is 0, the graded layers 8' and 9' sandwiching the ballast layer are omitted).

Figure 13:
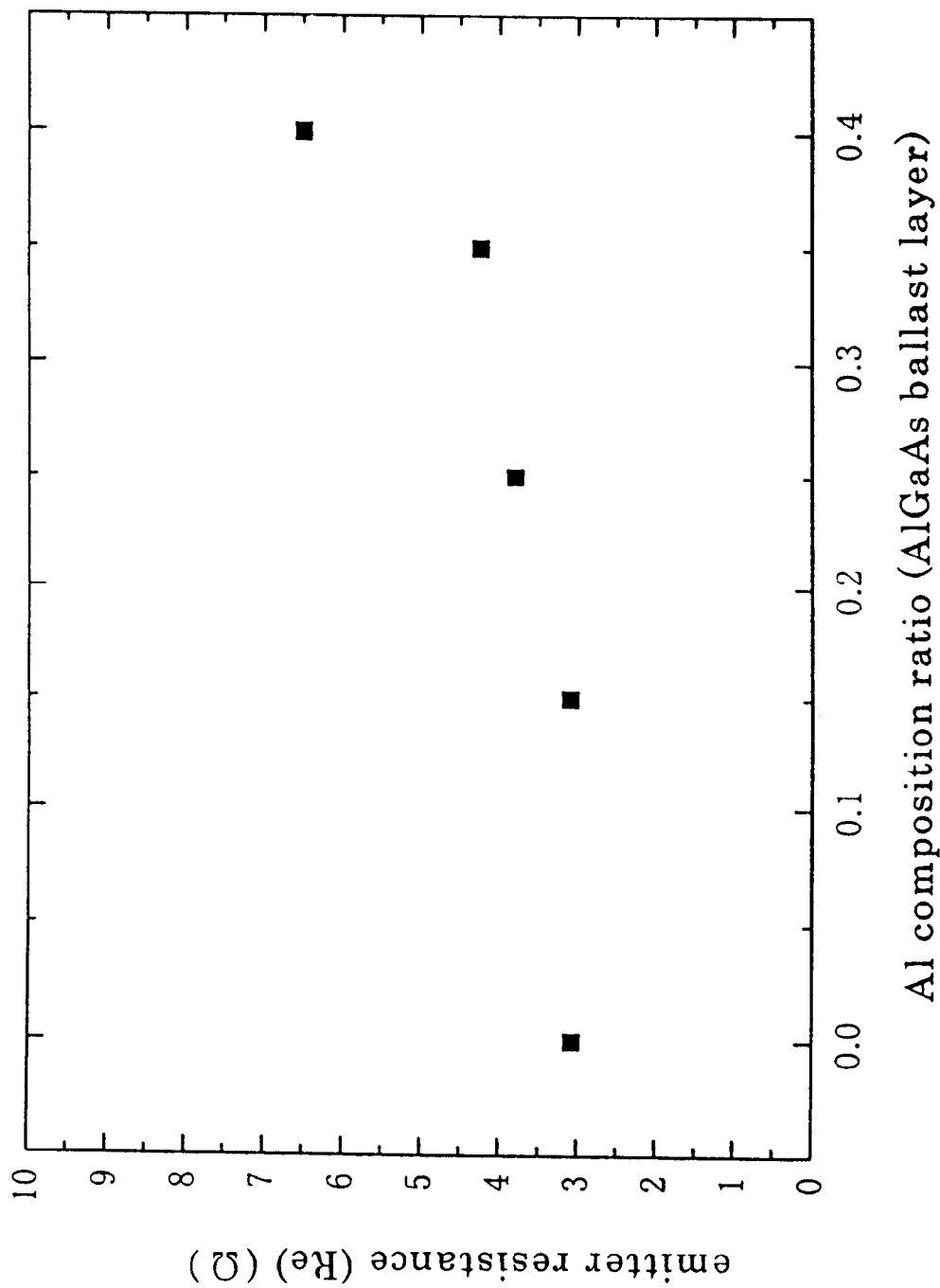
FIG. 13 is a chart showing the relationship between the emitter resistance (Re) around room temperature and the Al composition ratio of an AlGaAs ballast resistance layer in a heterojunction bipolar transistor produced as a control to a heterojunction bipolar transistor in accordance with the present invention.
Figure 14:
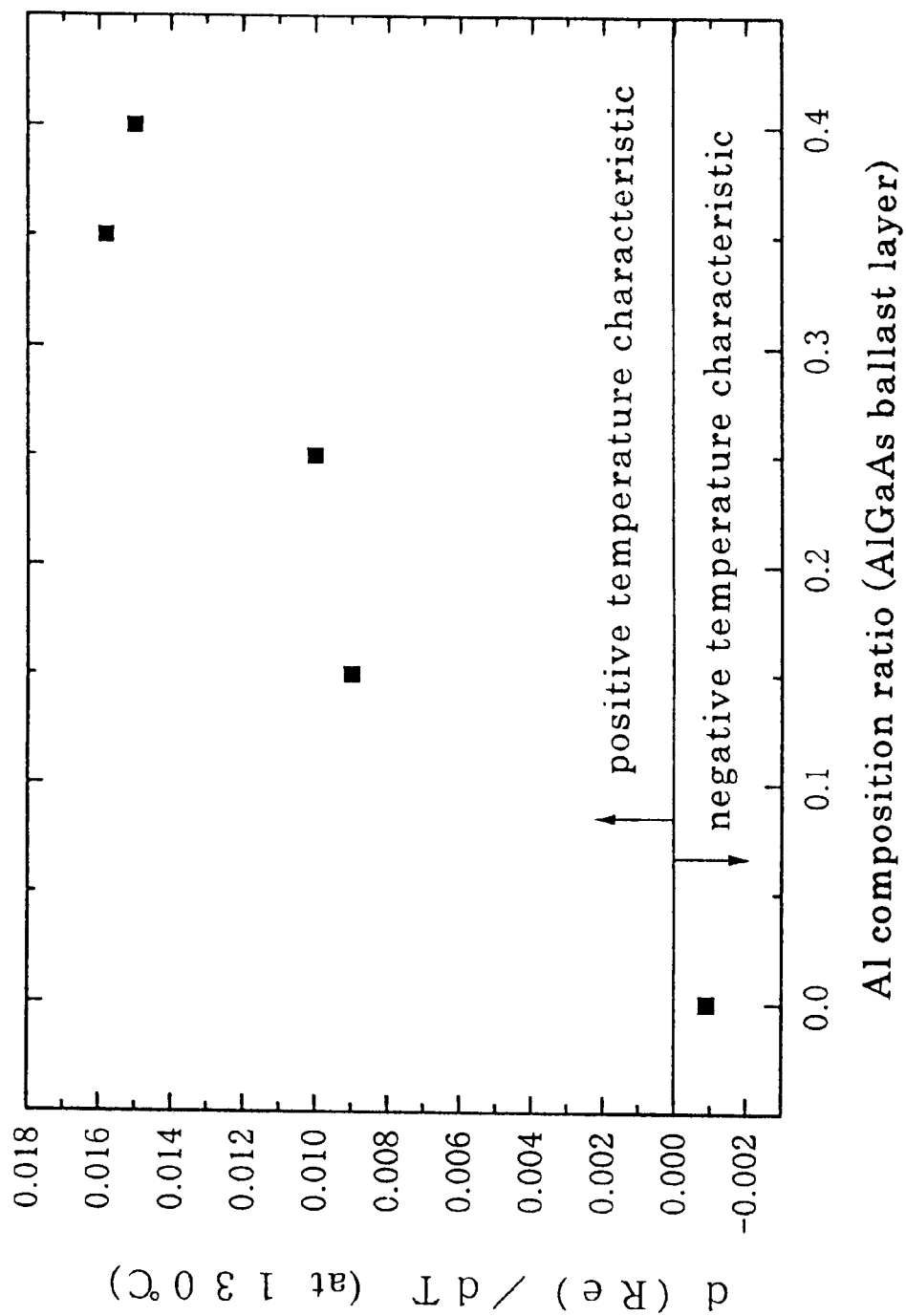
FIG. 14 is a chart showing the relationship between the temperature dependence and the Al composition ratio of an AlGaAs ballast resistance layer in a heterojunction bipolar transistor produced as a control to a heterojunction bipolar transistor in accordance with the present invention.

FIG. 13 shows the relationship between the emitter resistance (Re) around room temperature and the Al composition ratio in the AlGaAs ballast layer in these transistors, and FIG. 14 shows the temperature dependence at 130° C. of transistor. As shown in FIG. 13, the emitter resistance (Re) is remarkably large where the Al composition ratio in the AlGaAs ballast resistance layer is 0.4. As shown in FIG. 14, the temperature characteristics of the emitter resistance (Re) is positive where the Al composition ratio is 0.15 or higher. That is, the lower limit (0.15) of the Al composition ratio in the AlGaAs ballast resistance layer is determined by the temperature characteristics of the emitter resistance (Re) and the upper limit (0.35) is determined by the absolute value of the emitter resistance (Re) around room temperature, at which the thermal runaway does not occur yet.

According to the heterojunction bipolar transistor of the present invention, the thermal runaway can be effectively suppressed and also an AlGaAs emitter layer having uniform thickness can be formed thanks to the GaAs selective etching layer on the AlGaAs emitter layer. As a result, it is possible to stabilize the characteristics of the heterojunction bipolar transistor and improve the production yield of heterojunction bipolar transistors.

What is claimed is:

1. A heterojunction bipolar transistor comprising:

a ballast resistance layer between an AlGaAs inclusive emitter layer and an emitter electrode, wherein the ballast resistance layer comprises $n-Al_xGa_{1-x}As$, wherein $0<X<1$, a GaAs inclusive selective etching layer is provided between the emitter layer and the ballast resistance layer, and wherein said ballast resistance layer is doped with an impurity, and a concentration of said impurity in said ballast resistance layer is lower than that of an impurity with which the emitter layer is doped.

2. A heterojunction bipolar transistor according to claim 1 further comprising an InGaAs contact layer immediately under the emitter electrode.

3. A heterojunction bipolar transistor according to claim 1, wherein the Al composition ratio X of the $n-Al_xGa_{1-x}As$ ballast resistance layer is higher than 0 and lower than or equal to 0.4, i.e., $0<X\leq0.4$.

4. A heterojunction bipolar transistor according to claim 1, wherein the Al composition ratio X of the $n-Al_xGa_{1-x}As$ ballast resistance layer is 0.15 or higher and 0.35 or lower, i.e., $0.15\leq X\leq0.35$.

5. A heterojunction bipolar transistor according to claim 1, wherein the GaAs selective etching layer has a lower electric resistance than the ballast resistance layer.

6. A heterojunction bipolar transistor according to claim 1, wherein the GaAs selective etching layer has a thickness of 100 to 300 nm.

7. A heterojunction bipolar transistor according to claim 1, wherein the GaAs selective etching layer has a selective etching ratio of 50 or more with respect to the AlGaAs emitter layer.

8. The heterojunction bipolar transistor of claim 1, wherein the concentration of the impurity in the ballast resistance layer is from $1 \times 10^{16}$ to $2 \times 10^{17}/cm^3$.

* * * * *